US008228072B2

(12) United States Patent
Hagen

(10) Patent No.: US 8,228,072 B2
(45) Date of Patent: Jul. 24, 2012

(54) TEST AND MEASUREMENT INSTRUMENT WITH AN AUTOMATIC THRESHOLD CONTROL

(75) Inventor: Michael S. Hagen, Vancouver, WA (US)

(73) Assignee: Tektronix, Inc., Beaverton, OR (US)

( * ) Notice: Subject to any disclaimer, the term of this patent is extended or adjusted under 35 U.S.C. 154(b) by 579 days.

(21) Appl. No.: 12/428,589

(22) Filed: Apr. 23, 2009

(65) Prior Publication Data

US 2010/0271075 A1 Oct. 28, 2010

(51) Int. Cl.
*G01R 19/00* (2006.01)
*G01R 31/00* (2006.01)
*G01P 21/00* (2006.01)
*G01D 1/00* (2006.01)

(52) U.S. Cl. ............ 324/555; 324/76.11; 702/108; 702/127

(58) Field of Classification Search .......... 324/76.11, 324/555; 702/1, 57, 108, 127
See application file for complete search history.

(56) References Cited

U.S. PATENT DOCUMENTS

| 5,489,946 | A | * | 2/1996 | Kommrusch et al. | 348/528 |
| 5,572,143 | A | * | 11/1996 | Myers et al. | 324/555 |
| 6,323,694 | B1 | * | 11/2001 | Creek | 327/69 |
| 6,625,475 | B1 | * | 9/2003 | Iwahara et al. | 455/565 |
| 7,002,334 | B2 | * | 2/2006 | Tanaka et al. | 324/76.11 |
| 7,592,844 | B2 | * | 9/2009 | Colbeck | 327/65 |
| 7,671,777 | B2 | * | 3/2010 | Yamada et al. | 341/165 |
| 7,789,558 | B2 | * | 9/2010 | Yoshida et al. | 374/178 |
| 2004/0012842 | A1 | * | 1/2004 | Hakomori et al. | 359/333 |
| 2009/0096465 | A1 | * | 4/2009 | Kojima | 324/555 |

* cited by examiner

*Primary Examiner* — Hoai-An D Nguyen
(74) *Attorney, Agent, or Firm* — Derek Meeker; Thomas F. Lenihan

(57) ABSTRACT

A test and measurement instrument including a plurality of channels, each channel configured to receive a corresponding input signal. Each channel includes a comparator configured to compare the input signal to a threshold for the channel; an edge detector configured to detect an edge of an output signal of the comparator; and a threshold controller configured to adjust the threshold for the channel in response to the edge detector.

10 Claims, 3 Drawing Sheets

US 8,228,072 B2

TEST AND MEASUREMENT INSTRUMENT WITH AN AUTOMATIC THRESHOLD CONTROL

BACKGROUND

This disclosure relates to test and measurement instruments, in particular to test and measurement instruments having an automatic threshold control.

Test and measurement instruments can use a comparator to sense a logic level of an input signal. For example, a logic analyzer is designed to sample digital data. Such digital data can have logic levels represented by different voltage levels. To determine the logic level of the digital data, the logic analyzer compares the input signal to a threshold. When the signal is on one side of the threshold, the input signal is interpreted as a first one of the logic levels such as a zero. When the input signal is on another side of the threshold, the input signal is interpreted as a second one of the logic levels such as a one.

However, different logic families can have different levels and corresponding different thresholds. Moreover, a threshold for a particular level of performance may need to be offset from an theoretical value such as half-way between two logic levels.

A user can manually set such a threshold. Alternatively, a logic analyzer can acquire a series of samples of an input signal for a variety of thresholds. Once the multiple series of sampled data are acquired, a determination can be made on boundaries between transitioning data and steady state data. A threshold can be selected that is between the boundaries.

SUMMARY

An embodiment includes a test and measurement instrument including a plurality of channels, each channel configured to receive a corresponding input signal. Each channel includes a comparator configured to compare the input signal to a threshold for the channel; an edge detector configured to detect an edge of an output signal of the comparator; and a threshold controller configured to adjust the threshold for the channel in response to the edge detector.

Another embodiment includes a method of setting a first threshold in a test and measurement instrument including comparing an input signal to a second threshold; categorizing the second threshold in response to an edge detected from the comparing; adjusting the second threshold; and setting the first threshold in response to the categorization of the second threshold.

DETAILED DESCRIPTION

Embodiments include test and measurement instruments having an automatic threshold control. In particular, in an embodiment, a threshold for a channel can be automatically set in response to edges and/or states of an input signal.

Figure 1:
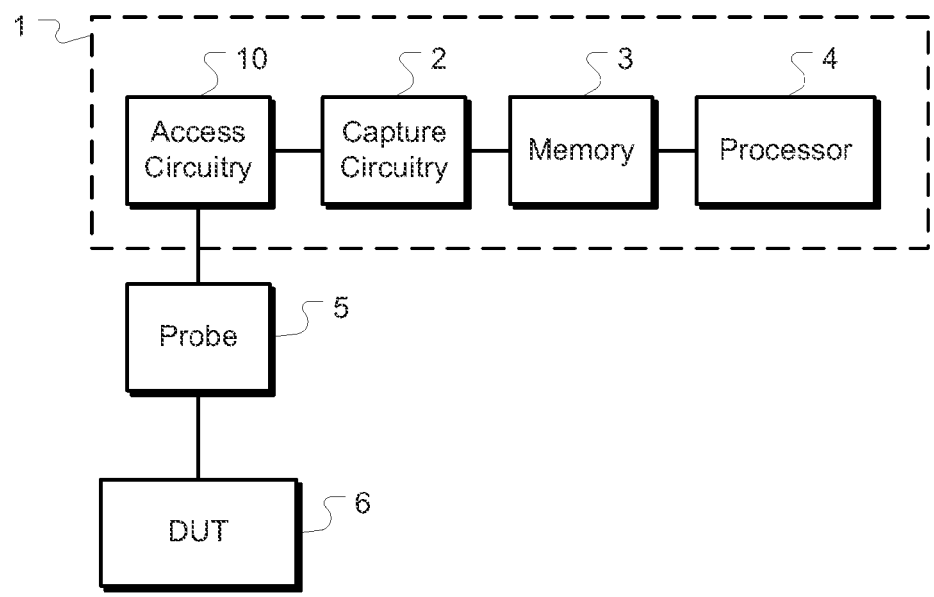
FIG. 1 is a block diagram of a test and measurement instrument according to an embodiment.

FIG. 1 is a block diagram of a test and measurement instrument according to an embodiment. The test and measurement instrument 1 includes access circuitry 10, capture circuitry 2, memory 3, and a processor 4. As illustrated, the test and measurement instrument 1 is coupled to a probe 5. The probe 5 is coupled to a device under test (DUT) 6. As a result, a signal on the DUT 6 can be provided to the access circuitry 10 of the test and measurement instrument 1 through the probe 5.

As used herein, the access circuitry 10 is the front-end circuitry that conditions the signal from the DUT 6 into a format for the capture circuitry 2. For example, the test and measurement instrument 1 can be a logic analyzer. The access circuitry 10 can be a comparator configured to convert the signal from the DUT 6 into a digital signal. The capture circuitry 2 is coupled to the access circuitry 10 and configured to capture the conditioned signal. For example, the capture circuitry 2 can include latches, sample-and-hold circuits, or the like. Once the digital data has been captured, it can be stored in the memory 3 and further processed, presented, or the like by the processor 4.

In an embodiment, the access circuitry 10 is configured to automatically set a threshold for the conversion of the input signal into the digital signal. For example, as described above, the access circuitry 10 can include a comparator. The comparator can compare the input signal to the threshold. That threshold can be automatically generated within the access circuitry 10. As will be described in further detail below, in an embodiment, the threshold can be generated without lengthy acquisitions of data for multiple thresholds involving the entire acquisition and processing chain of the access circuitry 10, capture circuitry 2, memory 3, and processor 4.

Figure 2:
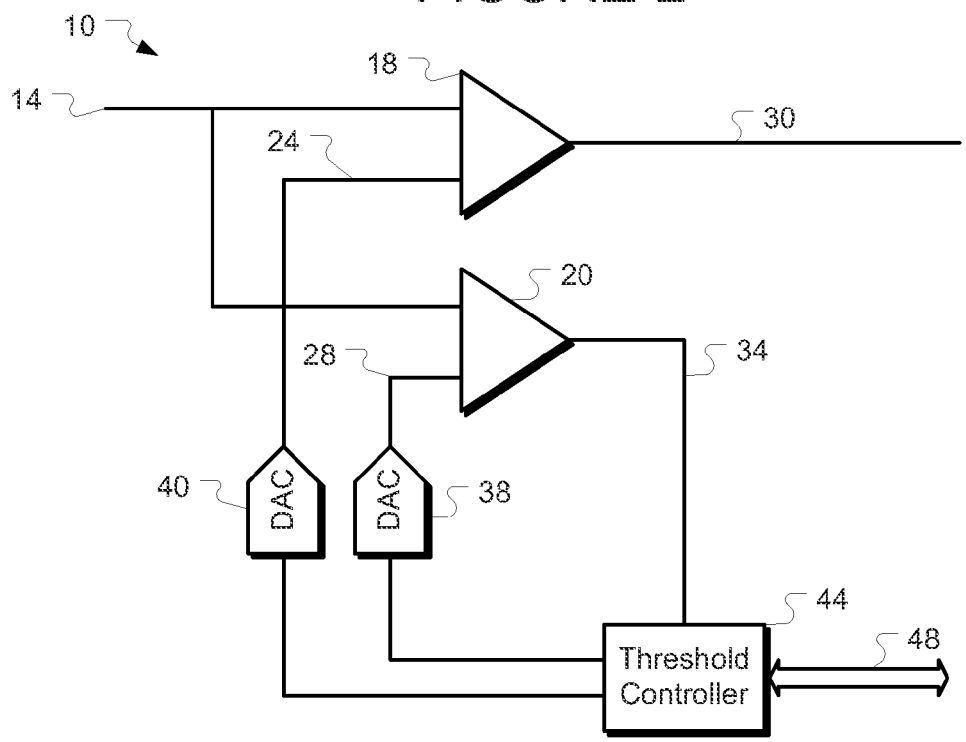
FIG. 2 is a block diagram of access circuitry of a test and measurement instrument having an automatic threshold control according to an embodiment.

FIG. 2 is a block diagram of access circuitry of a test and measurement instrument having an automatic threshold control according to an embodiment. In this embodiment, the access circuitry 10 includes a first comparator 18 and a second comparator 20. Each of the comparators is coupled to an input 14 and configured to compare an input signal on the input 14 to a threshold. In an embodiment, the input 14 is an input to a logic analyzer. For example, the input 14 can be a channel coupled to the probe 5 of FIG. 1 and configured to sense a clock signal on the DUT 6. However, the input 14 can be any type of input where a threshold relative to the input signal received through the input is used.

The access circuitry 10 also includes a first threshold circuit 40 and a second threshold circuit 38. The first threshold circuit 40 and the second threshold circuit 38 are respectively configured to provide a first threshold 24 and a second threshold 28 to the first comparator 18 and the second comparator 20. Accordingly, the first comparator 18 is configured to compare the input signal to the first threshold 24 and the second comparator 20 is configured to compare the input signal to the second threshold 28.

In this embodiment, the first threshold circuit 40 and the second threshold circuit 38 are illustrated as digital to analog converters (DAC). However, other variable threshold circuits can be used. For example, the electrically controllable potentiometers, controllable current sources, controllable voltage sources, or the like can be used. Any threshold circuit appropriate to the particular comparator can be used.

In this embodiment, the first comparator 18 is in the path for acquisition of data. That is, the input signal is conditioned by the comparator 18 into digital data 30. The digital data 30 is output to the capture circuitry 2 as described above. Accordingly, in this embodiment, the first threshold 24 is the threshold used in acquisition of data in the test and measurement instrument 1.

An output 34 of the second comparator 20 is coupled to a threshold controller 44. The threshold controller 44 is coupled to the first threshold circuit 40, the second threshold circuit 38, and the second comparator 20. The threshold controller 44 is configured to adjust the first threshold 24 in response to the second comparator 20. In particular, the threshold controller 44 can be responsive to the output 34 from the second comparator 20. For example, in an embodiment, the second threshold 28 can be varied by the threshold controller 44. The threshold controller 44 can sense the output 34 for a particular second threshold 28. The output 34 can be sensed for multiple second thresholds 28. A threshold suitable for the particular input signal can be found using the responses sensed on the output 34 for the various second thresholds 28.

Once found, that threshold can be used as the first threshold 24. Thus, an additional comparator, namely the second comparator 20, can be used in the access circuitry 10 to establish the first threshold 24, which is used as the threshold for the acquisition of data. Note that the threshold that is used as the first threshold 24 can, but need not be any of the second thresholds 28 used in determining the first threshold 24.

In an embodiment, the threshold controller 44 can be configured to continuously scan the second threshold 28. That is, even though a first threshold 24 has been established as described above, the threshold controller 44 can continue to search for the threshold. Accordingly, the searching for a threshold can be performed without affecting the performance of the comparison of the first comparator 18.

In an embodiment, the first comparator 18 and the second comparator 20 can be integrated on a single semiconductor die. In fact, the comparators 18 and 20 can be integrated such that the comparators can be matched in size, speed, layout, or the like to be as similar as desired. As a result, when the input is compared to the second threshold 28 in the second comparator 20 and used to establish the first threshold 24, the matching of the comparators 18 and 20 allows for a more accurate threshold to be established. That is, any offsets, parasitics, or the like that affect the first comparator 18 will likely affect the second comparator 20 and will be inherently accounted for in the process of using the second comparator 20 to establish the first threshold 24 for the first comparator 18.

Figure 3:
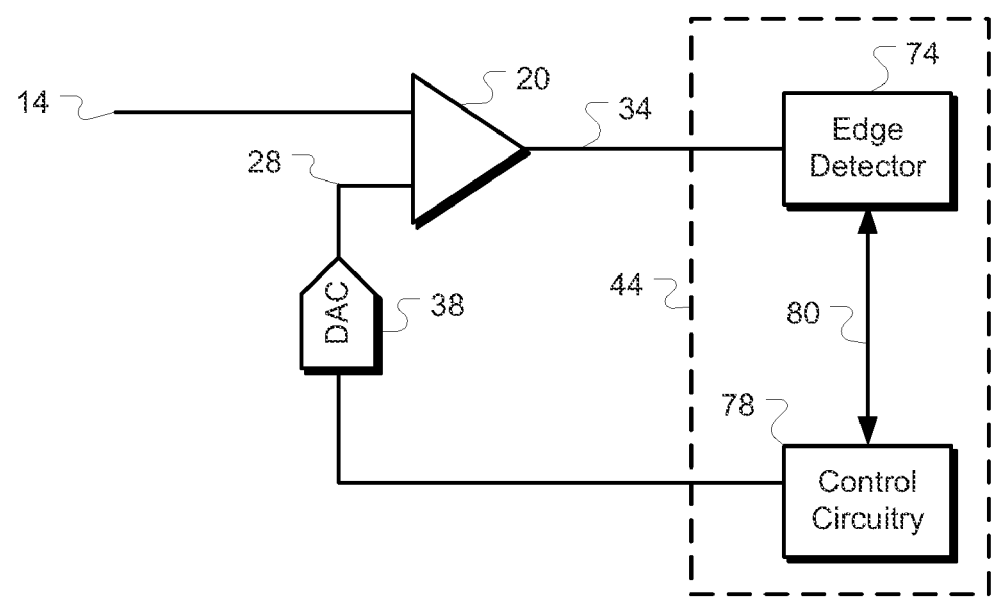
FIG. 3 is a block diagram of an example of a threshold controller of FIG. 2 including an edge detector.

FIG. 3 is a block diagram of an example of a threshold controller of FIG. 2 including and edge detector. In this embodiment, the threshold controller 44 includes an edge detector 74 and a control circuitry 78. The edge detector is configured to detect an edge of the output 34 of the second comparator 20. The threshold controller 44 is configured to adjust the first threshold 24 in response to the edge detector 74. That is, as described above, the variation of the second threshold 28 and the output of the second comparator 20 can be used to determine a setting for the first threshold 24. In particular, in this embodiment, the characteristic of the output 34 of the second comparator 20 that is used in determining the threshold for the first threshold 24 is an edge of the output 34.

The edge detector 74 can be implemented in a variety of ways, for example, logic gates can combine the output 34 with a delayed version of itself to generate a pulse on an edge. In another example, flip-flop can be clocked by the output 34. Any technique of identifying an edge can be used. Moreover, the edge detector 74 can be configured not only to identify an edge, but also to indicate a direction of the edge, such as rising or falling.

The control circuitry 78 is coupled to the edge detector 74 through connection 80. Through connection 80, an indication of an edge can be communicated to the control circuitry 78. The control circuitry 78 is configured to adjust the first threshold 24 in response to the edge detector 74. The control circuitry 78 is also configured to adjust the second threshold 28. Thus, the control circuitry 78 can be configured to respond to the edge detector 74, vary the second threshold 28, and then adjust the first threshold 24 as described above.

The control circuitry 78 can be implemented in a variety of ways. For example, the control circuitry 78 can be a state machine. In another example, the control circuitry 78 can be a processor. In another example, the control circuitry 78 can be an application specific integrated circuit.

Figure 4:
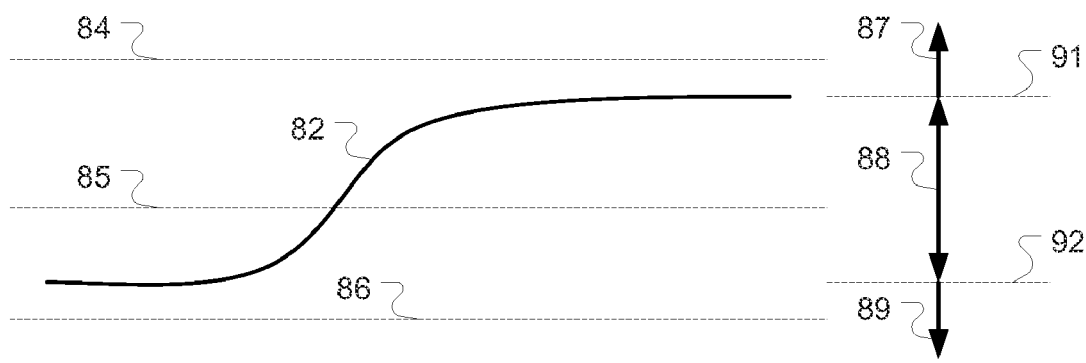
FIG. 4 is a graph illustrating multiple thresholds used in a threshold controller according to an embodiment.

FIG. 4 is a graph illustrating multiple thresholds used in a threshold controller according to an embodiment. Referring to FIGS. 3 and 4, an operation of the threshold controller 44 will be described. In an embodiment, the threshold controller 44 is configured to set the second threshold 28 to a plurality of thresholds over time. That is, the threshold controller 44 can scan the second threshold 28.

For example different thresholds are illustrated in FIG. 4 by thresholds 84-86. An example of an input signal is given by signal 82. For illustration, threshold 84 is a level higher than the signal 82, threshold 85 is a level within the extent of signal 82, and threshold 86 is a level less than the signal 82. Although three thresholds 84-86 have been illustrated, any number of thresholds above, below, within, or the like can be used.

In an embodiment, the threshold controller 44 is configured to categorize each of the thresholds with at least one of a transition region, a first steady state, and a second steady state. As illustrated, region 87 is a high steady state, region 89 is a low steady state, and region 88 is a transition region.

For illustration, consider when the second threshold 28 is set to the threshold 85. The input 14 is compared to this threshold 85. As a result, the output 34 of the comparator 20 will change when the signal 82 passes threshold 85. Accordingly, an edge will be presented to the edge detector 74 on output 34. The edge detector 74 can report the detection of the edge to the control circuitry 78.

The control circuitry 78 can then categorize the threshold 85. In particular, the control circuitry 78 can categorize the threshold 85 as in the transition region 88. In other words, since an edge was detected, the threshold 85 can be interpreted as being within the logic levels of the input 14.

In contrast, for each of thresholds 84 and 86, no edges will appear at the output of the comparator 20. For example, when the second threshold 28 is set to the threshold 84, signal 82 is always lower than the threshold 84. Thus, the output 34 of the comparator 20 will not change. Thus, no edges will be detected by the edge detector 74. Accordingly, the threshold 84 can be categorized as a steady state. The control circuitry 78 can use the value of the particular threshold categorized as a steady state to determine in which of regions 87 or 89 it belongs.

Accordingly, each of the multiple thresholds used can be categorized as one of the regions 87-89. That is, the thresholds can be categorized as transitioning in region 88 or a steady state in regions 87 and 89. As a result, boundary 91 between the transition region 88 and the steady state region 87, and boundary 92 between the transition region 88 and the steady state region 89 can be determined. A threshold between these boundaries 91 and 92 can be selected. That is, a threshold within the transition region 88 can be selected. For example, a threshold half way between the boundaries 91 and 92 can be selected. The first threshold 24 can be set to this threshold. As a result, transitions of the input 14 can be accurately interpreted by the first comparator 18.

In an embodiment, the second threshold 28 can be scanned linearly from a low level to a high level or vice-versa. Each threshold of the scan can be categorized as described above. However, any technique of selecting thresholds can be used. For example, a binary search algorithm can be used to determine the boundary 91 without scanning through all of the possible thresholds in the transition region 88 and the steady state 87.

As described above, an edge can contribute to the categorization of a threshold. However additional criteria can be used to categorize a threshold. For example, a number of edges over a period of time can be established as a minimum number to categorize an edge as in the transition region 88. Accordingly, the threshold can be changed after that time, especially when there are no edges.

Figure 5:
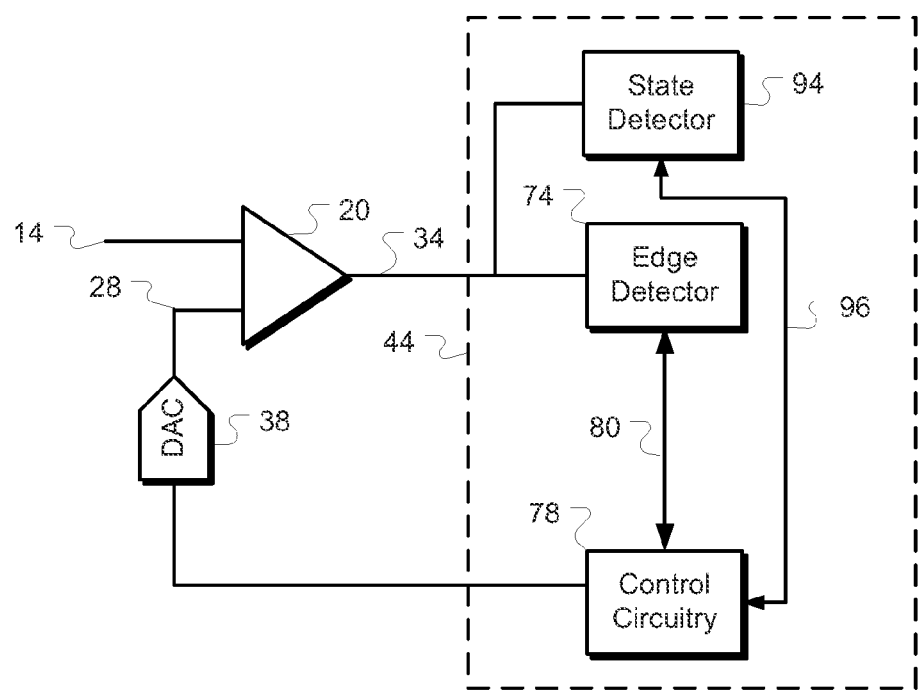
FIG. 5 is a block diagram of an example of a threshold controller of FIG. 2 including a state detector.

FIG. 5 is a block diagram of an example of a threshold controller of FIG. 2 including a state detector. In this embodiment the threshold controller 44 includes the edge detector 74 and control circuitry 78 similar to FIG. 3. However, the threshold controller 44 also includes a state detector 94. The state detector 94 is configured to determine a steady state value of the output 34 of the second comparator 20. The threshold controller 44 is configured to adjust the first threshold 24 in response to the state detector 94.

In an embodiment, the state detector 94 can be configured to monitor the output 34 of the comparator 20 for a steady state. This steady state can be used in the categorization of the second threshold 28. For example, as described above, if no edges have been detected for a given second threshold 28, the second threshold 28 can be categorized as one of the steady states 87 and 89. The output of the state detector 94 can be used to determine which state is appropriate.

Figure 6:
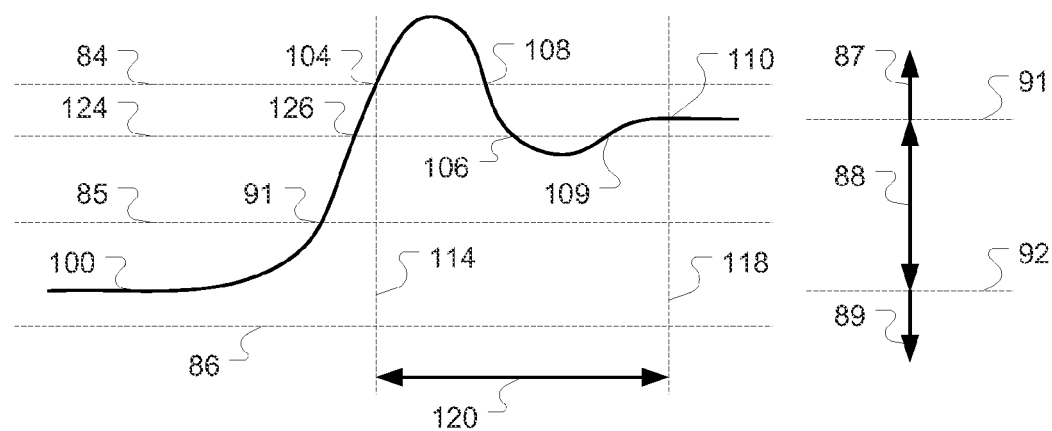
FIG. 6 is a graph illustrating multiple thresholds used in a threshold controller according to an embodiment with a signal having overshoot.

In an embodiment, the state detector 94 can also be used to accommodate overshoot, undershoot, or other distortions of the input 14. FIG. 6 is a graph illustrating multiple thresholds used in a threshold controller according to an embodiment with a signal having overshoot. Referring to FIGS. 5 and 6, an operation of the threshold controller 44 with the state detector 94 will be described. In FIG. 6, a different signal 100 with an overshoot is illustrated. The same thresholds 84-86, used in FIG. 4 are illustrated. An additional threshold 124 is also illustrated.

When the second threshold 28 is set to the threshold 86, no edges will be detected as before. Thus, the threshold 86 can be categorized as within the steady state region 89. In contrast, with threshold 84, which did not generate an edge with signal 82 of FIG. 4 where there was not overshoot, an edge can be generated when the signal 100 crosses the threshold 84 at point 104. However, since this threshold 84 is above the steady state level of signal 100, the threshold 84 should not be categorized as transitioning.

Accordingly, the steady state level of the output 34 of the comparator 20 can be used in categorizing the threshold. For example, when the signal 100 crosses the threshold 84, an edge will be generated and in particular, a rising edge. However the steady state as illustrated at point 110 is below the threshold 84. Thus, the steady state would be a low level. Given that the edge detected was a rising edge and the steady state is a low level, the threshold can be characterized as a high level steady state 87, even though an edge was detected. In other words, a threshold 84 that resulted in rising edge due to an overshoot can be categorized as in the steady state region 87.

A rising edge would be detected if the second threshold 28 was threshold 85 as described above. For example, when the signal 100 passed point 91, an edge would be generated and detected. However, in that circumstance, the steady state would be a high level as the steady state at point 110 is higher than the threshold 85. Thus, with a rising edge and a high level steady state, the threshold 85 can be categorized as in the transition region 88.

Similarly, for falling edges, the logic levels can be reversed. Thus, the with a falling edge, the second threshold can be categorized as transitioning if the steady state is a low level; and categorized the low level steady state if the steady state is a high level.

In an embodiment, the capturing of a state of the comparison of the input signal to the second threshold can be delayed a delay time after detecting an edge. For example, using the edge generated by the crossing of the signal 100 and the threshold 84 as an example, the capturing of the state of the comparison can be delayed by delay time 120. Accordingly, the signal can reach a steady state.

Overshoot can also introduce additional potentially undesired and/or confusing edges. For example, using threshold 84 as the second threshold 28, another edge can be detected due to a falling portion of the overshoot at point 108. Similarly, an undershoot can cause additional edges at points 106 and 109 with threshold 124. The use of these edges can result in mischaracterization of the particular threshold.

In an embodiment, the edge detection can be masked for a delay time after the detection of an edge. For example, after detection of the edge at point 104, a delay time 120 can pass before another edge detection is allowed. Accordingly, an edge that would have been generated by the transition at point 108 would not occur. Similarly, if the second threshold 28 was threshold 124, an edge can be generated at point 126. However, edges that would be generated by points 106 and 109 would be masked.

In another embodiment, the control circuitry 78 can be configured to disregard any edges during such time period 120. That is the edge detector 74 can report the edges, but no action is performed in response by the control circuitry 78. Thus, not only can spurious edge detection be prevented due to an overshoot, but also due to an undershoot.

Referring back to FIG. 1, only a single channel is illustrated. However, in an embodiment, the test and measurement instrument 1 can have multiple channels and hence, multiple access circuitries 10. Each channel can be configured to receive a corresponding input signal. The corresponding access circuit 10 of the channel can include the comparators, edge detectors, state detectors, threshold controllers, or the like as described above.

In an embodiment, each channel can have its own capture circuitry 2. Using the access circuit 10 as an example, the output 30 of the first comparator 18 can be captured by the capture circuitry 2. In particular, this output 30 can be the result of a comparison with the corresponding input 14 and the first threshold 24 that was established as described above.

In an embodiment, the first threshold 24 can be established automatically for the access circuitry 10 without using data output from the access circuitry 10. That is, the first threshold 24 can be established within the access circuitry 10 itself. Data need not be acquired and analyzed in order to automatically set the first threshold 24. For example, information need not propagate from the access circuitry 10 through the capture circuitry 2, the memory 3, and the processor 4, possibly multiple times, before a threshold can be established for the access circuitry 10.

In an embodiment, the processor 4 can be in communication with the threshold controller 44 of the access circuitry 10. For example, as illustrated in FIG. 2, a connection 48 can allow for communication between the two. The processor 4 can be in communication with multiple access circuitries 10, including all of the access circuitries 10 of the test and measurement instrument 1. As used herein a processor can include microprocessors, programmable logic devices, multiprocessor systems, digital signal processors, personal computers, or the like.

Accordingly, the processor 4 can receive an indication of the first threshold 24 of an access circuit 10 of a particular channel. Some channels may not have a sufficient number of edges to establish a first threshold 24 for the corresponding access circuit 10. For example, the probe 5 may not be connected, the probed signal may be in a steady state for an extended period of time, or the like. Accordingly, the first threshold 24 from one channel can be used to set the first threshold in another channel. In particular the channel without a sufficient number of edges can have its first threshold 24 set to that of another channel.

In addition, in an embodiment, the processor 4 can determine if a particular channel is coupled to a DUT. For example, if a signal on the input 14 of a particular channel is transitioning, the processor 4 can determine that the channel is connected to the DUT and configure the test and measurement instrument accordingly. For example, the processor 4 can be configured to display such channels.

In an embodiment, as the threshold detection can be performed automatically, as a user connects a DUT, the channels can be automatically displayed as they become available. In particular, where one channel has already been connected and has generated an automatic threshold and that threshold has been propagated to other unconnected channels, the unconnected channels can have an estimate of the correct threshold, improving the likelihood that when the channels are connected, valid data can be immediately acquired. That is, even though the newly connected channel may be scanning its own second threshold 28, the first threshold 24 may be sufficient to acquire valid data.

In another embodiment, the processor 4 can aggregate the thresholds from multiple access circuitries 10. For example, multiple channels may have similar, but not identical first thresholds 24. The processor 4 can be configured to adjust the first thresholds 24 to move the thresholds closer together, make the first thresholds 24 equal to an average value, or the like.

In another embodiment, a theoretical threshold can be used for the first threshold 24 based on the operation of the access circuitry 10. For example, as described above, the access circuitry 10 can determine boundaries 91 and 92 between various categories of thresholds. These boundaries 91 and 92 or the corresponding threshold levels, can be interpreted as logic levels. From the logic levels, a logic family of the circuit can be determined. For example, the logic levels can be compared against representative levels for various logic families, such as 3.3V CMOS, 2.5V CMOS, 1.8V CMOS, LVDS, or the like. Once the logic family is determined, the processor 4 can be configured to set the first threshold 24 to a theoretical value for that family. In an embodiment, a default value for such thresholds and the various matching criteria can be stored in the test and measurement instrument 1.

In an embodiment, the processor 4 can be configured to control when the first threshold 24 can be changed. For example, during an acquisition, the processor 4 can control the threshold controller 44 so that it does not update the first threshold 24, even though a new threshold has been determined.

Although two level logic has been described above, one or more thresholds can be established for multi-level logic. For example, two thresholds can be used for three level logic. The signal range can be divided into a high steady state, an upper transition region, a middle steady state, a lower transition region, and a low steady state. The various thresholds can be categorized into such regions.

Another embodiment includes an article of machine readable code embodied on a machine readable medium that when executed, causes the machine to perform any of the above described operations. An embodiment includes a machine readable storage medium storing machine readable code that when executed causes the machine to perform any of the above described operations. As used here, a machine is any device that can execute code. Microprocessors, programmable logic devices, multiprocessor systems, digital signal processors, personal computers, or the like are all examples of such a machine.

Although particular embodiments have been described, it will be appreciated that the principles of the invention are not limited to those embodiments. Variations and modifications may be made without departing from the principles of the invention as set forth in the following claims.

The invention claimed is:

1. A test and measurement instrument, comprising:
an input channel configured to receive an input signal;
a first comparator coupled to the input channel and configured to compare the input signal to a first threshold;
a second comparator coupled to the input channel and configured to compare the input signal to a second threshold;
a first threshold circuit configured to generate the first threshold;
a second threshold circuit configured to generate the second threshold; and
a threshold controller coupled to the first threshold circuit, the second threshold circuit, and the second comparator, and configured to adjust the first threshold in response to the second comparator.

2. The test and measurement instrument of claim 1, wherein the first comparator and the second comparator are integrated in a single die.

3. The test and measurement instrument of claim 1, wherein:
the threshold controller comprises an edge detector configured to detect an edge of a signal output from the second comparator; and
the threshold controller is configured to adjust the first threshold in response to the edge detector.

4. The test and measurement instrument of claim 3, wherein:
the threshold controller further comprises a state detector configured to determine a steady state value of the signal output from the second comparator; and
the threshold controller is configured to adjust the first threshold in response to the state detector.

5. The test and measurement instrument of claim 1, wherein:
the threshold controller is configured to set the second threshold to a plurality of thresholds over time; and the threshold controller is configured to categorize each of the plurality of thresholds with at least one of a transition region, a first steady state, and a second steady state.

6. A test and measurement instrument, comprising:
a plurality of channels, each channel configured to receive a corresponding input signal and including:
- a comparator configured to compare the input signal to a threshold for the channel;
- an edge detector configured to detect an edge of an output signal of the comparator; and
- a threshold controller configured to adjust the threshold for the channel in response to the edge detector.

7. The test and measurement instrument of claim 6, wherein for each of the channels, the threshold controller is further configured to scan the threshold for the channel.

8. The test and measurement instrument of claim 6, further comprising:
a processor coupled to each of the channels and configured to set a threshold of a first one of the channels based on a threshold of a second one of the channels if the first channel has detected a number of edges less than a minimum number of edges.

9. The test and measurement instrument of claim 6, wherein:
the threshold for each channel being referred to as a first threshold for the channel; and
each channel further comprises:
- a second comparator configured to receive to compare the input signal to a second threshold for the channel;
- wherein the threshold controller is configured to set the second threshold in response to detected edges from the edge detector for a plurality of thresholds as the first threshold.

10. The test and measurement instrument of claim 9, wherein:
each channel further comprises capture circuitry configured to capture a signal output from the second comparator; and
further comprising:
a memory configured to store data from the capture circuitry of each of the channels.

* * * * *